United States Patent
Yadlapalli et al.

(10) Patent No.: US 12,245,558 B2
(45) Date of Patent: Mar. 11, 2025

(54) ENHANCED PLANT GROWTH, YIELD, CHLOROPHYLL CONTENT AND NUTRITION VALUE THROUGH HIGH FREQUENCY IMPULSE WAVES

(71) Applicant: Kondala Rao Yadlapalli, Kurellagudem (IN)

(72) Inventors: Kondala Rao Yadlapalli, Kurellagudem (IN); Jagadish Prasad Aluru, Hyderabad (IN)

(73) Assignee: Kondala Rao Yadlapalli, Kurellagudem (IN)

( * ) Notice: Subject to any disclaimer, the term of this patent is extended or adjusted under 35 U.S.C. 154(b) by 0 days.

(21) Appl. No.: 17/917,566

(22) PCT Filed: Jul. 26, 2022

(86) PCT No.: PCT/IN2022/050672
§ 371 (c)(1),
(2) Date: Feb. 16, 2023

(87) PCT Pub. No.: WO2023/017530
PCT Pub. Date: Feb. 16, 2023

(65) Prior Publication Data
US 2024/0023491 A1    Jan. 25, 2024

(30) Foreign Application Priority Data

Aug. 10, 2021 (IN) .............................. 202141036108
Jul. 13, 2022 (IN) .............................. 202243040189

(51) Int. Cl.
*A01G 7/04* (2006.01)

(52) U.S. Cl.
CPC ...................................... *A01G 7/04* (2013.01)

(58) Field of Classification Search
CPC ..................................... A01K 7/06; A01K 7/04
See application file for complete search history.

(56) References Cited

U.S. PATENT DOCUMENTS 1,737,866 A      12/1929   Roe
1,952,588 A  *   3/1934    Golden .................... A61N 1/10
                                                             256/10

(Continued)

FOREIGN PATENT DOCUMENTS

CN       103495189 A     1/2014
EP       0729796 B1      2/2000

(Continued)

*Primary Examiner* — Monica L Perry
*Assistant Examiner* — Aaron M Rodziwicz
(74) *Attorney, Agent, or Firm* — Harita S Achanta (57) ABSTRACT

Enhanced growth, yield, chlorophyll, and nutrition value of plants is achieved by using a vector sum of high frequency impulse waves resulting from an intersection of fixed and variable frequency waves targeted below the soil. This results in an avalanche of waves with a broad range of frequencies travelling at very high velocities, thereby creating micro cracks and nano cracks in the roots. These high frequency impulse waves are created by a system comprising two microcontrollers and an energy source. Each of the microcontrollers comprises an oscillator, a buffer amplifier, a reset circuit, electrode terminals, and an IOT module. The first microcontroller also comprises a modulator and a feedback circuit. The high frequency waves reduce the water requirement of the plants, and their susceptibility to pest attack.

23 Claims, 5 Drawing Sheets

(56) References Cited

U.S. PATENT DOCUMENTS

| | | | | |
|---|---|---|---|---|
| 3,243,726 A * | 3/1966 | Aemmer | .............. | H03B 5/36 |
| | | | | 331/161 |
| 5,464,456 A * | 11/1995 | Kertz | .............. | A47G 7/02 |
| | | | | 47/60 |
| 5,731,265 A * | 3/1998 | Hou | .............. | A01G 7/04 |
| | | | | 47/DIG. 12 |
| 5,740,627 A * | 4/1998 | Levengood | .............. | A01H 3/00 |
| | | | | 47/1.3 |
| 6,280,601 B1 | 8/2001 | Doring | | |
| 2019/0127240 A1 * | 5/2019 | Engle | .............. | A01G 7/04 |
| 2022/0015302 A1 * | 1/2022 | Holland | .............. | B06B 1/045 |
| 2022/0287245 A1 * | 9/2022 | Cordova | .............. | A01G 7/04 |
| 2022/0312685 A1 * | 10/2022 | Stephen | .............. | H02M 3/33507 |
| 2022/0322609 A1 * | 10/2022 | Richter | .............. | H04B 5/79 |
| 2023/0028378 A1 * | 1/2023 | Stephen | .............. | F24F 8/99 |
| 2023/0108976 A1 * | 4/2023 | Zamanzadeh | .............. | A01G 7/00 |
| | | | | 47/1.3 |
| 2023/0200309 A1 * | 6/2023 | Kim | .............. | C25B 1/04 |
| | | | | 47/58.1 R |
| 2024/0008417 A1 * | 1/2024 | Cordova | .............. | A01C 1/00 |

FOREIGN PATENT DOCUMENTS

| | | | | |
|---|---|---|---|---|
| FR | 3061835 A1 * | 7/2018 | .............. | A01C 1/00 |
| GB | 2579772 A * | 7/2020 | .............. | A01G 7/04 |
| WO | WO-2013184169 A2 * | 12/2013 | .............. | A01C 1/02 |

* cited by examiner

ENHANCED PLANT GROWTH, YIELD, CHLOROPHYLL CONTENT AND NUTRITION VALUE THROUGH HIGH FREQUENCY IMPULSE WAVES

CROSS-REFERENCE TO RELATED APPLICATIONS

The present application is a continuation of an International Application Number PCT/IN2022/050672, with a filing date of Jul. 26, 2022, the entire disclosure of which is incorporated herein by reference for all purposes. The present application claims the benefit of foreign priority application numbers IN202141036108, with a filing date of Aug. 10, 2021, and IN202243040189, with a filing date of Jul. 13, 2022, the entire disclosures of which are incorporated herein by reference for all purposes.

FIELD OF THE INVENTION

The invention is primarily related to a method of enhancing plant growth, yield, chlorophyll content and nutrition value of crops by subjecting them to high frequency impulse waves of different frequencies that intersect each other and generate a range of vector sum of frequencies within the soil by enhancing the mobility of nutrients within the plants and the soil. The invention reduces plants' requirement of water, fertilizers and pesticides, and the plants' susceptibility to attack by pests, weeds and pathogens.

BACKGROUND OF THE INVENTION

The main aim of farmers worldwide is to improve yield and reduce plant diseases for a given arable land. Although soil may contain the required nutrients, farmers are forced to use excessive fertilizers because of poor mobility of nutrients in soil. The fertilizers that are applied to soil for promoting plant growth, are only partially used by plants. The balance amount mixes with water and pollutes the soil. If we continue to apply fertilizers in the same way, then soil salinity will increase, fertility will decline, and so also the arable land for cultivation. This will further increase the requirement of fertilizers leading to a vicious circle which will be harmful to planet earth. The reduction of fertilizers will greatly reduce the soil salinity.

The current invention is aimed at a novel approach whereby the nutrients in the soil are made to move up the plants resulting in increase in growth, yield, chlorophyll content and their nutrition value, thereby providing improved nutrition for the consumers.

The invention also makes the plants less susceptible to attack by weeds, pests, and pathogens. This reduces the amount of pesticides used during cultivation by more than 50%, thereby reducing the harmful chemicals and heavy metals in food supply chain which cause adverse health effects.

The invention will also help reduce carbon emissions associated with the manufacture and transportation of fertilizers and pesticides, by more than 50%.

U.S. Pat. No. 6,280,601B1 discloses a method for sterilizing microorganisms and decomposing organic and inorganic pollutants in a contaminated soil or ground water by applying direct electric current to electrodes which are incorporated into a region of soil. A voltage of at least 0.4 V per meter of distance per pair of electrodes is applied to additionally increase said natural polarization and capacitance of the soil particles thereby effecting processes of cathodic reduction at negatively charged interfaces of the soil particles, and simultaneously effecting processes of anodic oxidation at positively charged interfaces of the soil particles. This results in generation of agents for said anodic oxidation and cathodic reduction by water electrolysis.

U.S. Pat. No. 1,737,866A discloses high frequency current that is passed through the soil intervening between two electrodes. The ionizing effect of high frequency currents passing through loosened dry soil produce carbonate of ammonia in wet soil. When the high frequency electrical currents pass through moist aerated soil, it results in the formation of nitric acid, nitrous oxide, and ammonia. A certain amount of ozone is also formed, which especially in the presence of sunlight, has an oxidizing action, aiding in sweetening the soil and preventing fermentation. The process of nitrogen fixation is effected in fairly loose soil.

CN103495189A discloses a radio-frequency wave that causes relaxation, rupture and recombination of the hydrogen bonds. This results in chromosomal aberration, which plays a role in killing germs.

EP0729796B1 discloses a process for the sterilization of microorganisms and mineralization of organic substances in the soil by a direct current applied to electrode pairs built into the soil. The soil particles between the electrodes which are naturally polarized are additionally polarized by the generated electric field. The polarization of microorganisms at the interface between ground water and cell wall is exploited in this invention. A minimum voltage of 0.4 to 2 VDC is applied to each pair of electrodes, and to each meter of electrode spacing. Thus, the processes of cathodic reduction of the negatively charged surfaces and anodic oxidation of the positively charged surfaces of the soil particles take place. This alters the natural polarization of soil particles and simultaneously effects an in-situ reduction of soil contaminants The agents for said anodic oxidation and cathodic reduction are generated by water electrolysis.

Plant growth and yield depend on absorption of nutrients by plants. Most nutrients present in the soil which are needed for improving plant growth and yield, are not very mobile in the soil and are much less mobile within the plants. The immobility of nutrients is the main reason for reduced plant growth and yield. To counter this, excessive fertilizers are added, which in turn causes soil pollution and water pollution ultimately affecting aquatic life.

Thus, there is a strong need to develop a simple eco-friendly technique that will help improve the plant growth and yield, and at the same time improve the chlorophyll content and nutritional value of plants without causing any damage to the soil, arable land or environment.

OBJECT OF THE INVENTION

The principal object of the present invention is to improve the growth and yield of plants through the application of high frequency impulse waves that intersect each other within the soil.

Another object of the invention is to enhance the chlorophyll content of the plants which thereby enhances photosynthesis.

Another object of the invention is to enhance the nutrition value of plant products by at least 2 to 3 times so that the nutrition value is high for human and animal consumption.

Another object of the invention is to enable carbonic acid generation in the roots to facilitate better ion exchange, and enhance nutrient movement in plant membranes.

Another object of the invention is to improve oxygen permeability in the roots by increasing soil permeability and creating nano cracks in the soil.

Another object of the present invention is to enable generation of hydrogen by splitting the water molecules which will prevent attack by weeds, pests, and pathogens.

Another object of the invention is to create a resultant vector sum of broad range of frequencies to break biofilms in all types of plants to enhance the functioning of xylem and phloem, and improve the transportation of nutrients within plants.

Another object of the invention is to increase the strength of the microstructure of plant stems to reduce attack by weeds, pests and pathogens on the crops.

Another object of the invention is to improve the transportation of carbohydrates and glucose from plant leaves to roots.

Another object of the invention is to enhance the nitrogen fixation ability in the soil.

Another object of the invention is to enhance the carbon sequestration potential of the soil.

Another object of the invention is to reduce usage of fertilizer for crop cultivation and protect soil acidification, and water pollution, and thereby protect environment and aquatic life.

Another object of the invention is to reduce the use of pesticides thereby protecting the environment and the health of consumers.

Yet another object of the invention is to reduce greenhouse gas emissions resulting from the manufacture, transportation and application of fertilizers and pesticides.

SUMMARY OF THE INVENTION

The present invention deals with a method of improving plant growth, yield, chlorophyll content and nutrition value of food using a range of high frequency impulse waves of different frequencies inside soil such that when impulses of different frequencies intersect each other within the soil, they generate a resultant vector sum of waves which can cover a broad spectrum of waves. It results in better nitrogen fixation, Soil Organic Carbon (SOC) and mobility of nutrients in soil and plants, thus enhancing growth, yield and nutrition value. It also results in the use of reduced amounts of fertilizers and pesticides, while creating less susceptibility to attack by weeds, pests and, pathogens. It also enhances carbon sequestration potential of the soil through enhanced conversion of inorganic carbon dioxide into soil organic carbon. The benefits accrue to any type of plant, crop or soil, irrespective of its moisture content.

DETAILED DESCRIPTION

The summary of the present invention, as well as the detailed description, are better understood when read in conjunction with the accompanying drawings that illustrate one or more possible embodiments of the present invention.

In some embodiments described herein, the terms "Control plants" and "untreated plants", i.e., plants not treated with high-frequency waves may be used interchangeably; "Control fields" and "untreated fields" may be used interchangeably; and "Control lands" and "untreated lands" may be used interchangeably.

The invention deals with a method of enhancing plant growth, yield and nutrition value, by using high frequency impulse waves resulting from an intersection of fixed and variable frequency impulse waves. When the resulting vector sum of waves are directed into the soil, they enhance plant output in terms of growth, yield and nutrition value. This enhancement is observed when less amounts of fertilizers is used. The plants' susceptibility to pests and virus attack is minimized even when less amounts of pesticides are used.

Figure 1:
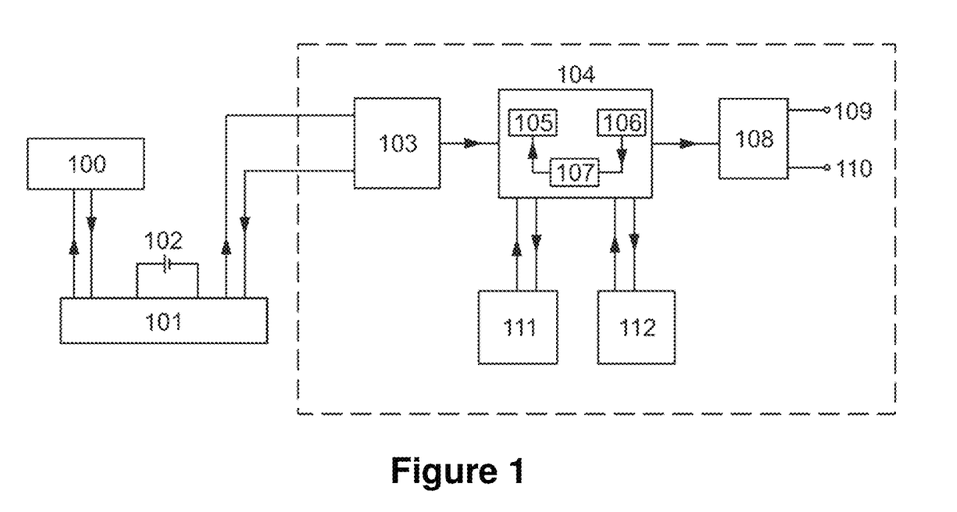
FIG. 1 is a schematic diagram of a high frequency impulse generator circuit for generating variable frequency of 10 KHz to 40 KHz.
Figure 2:
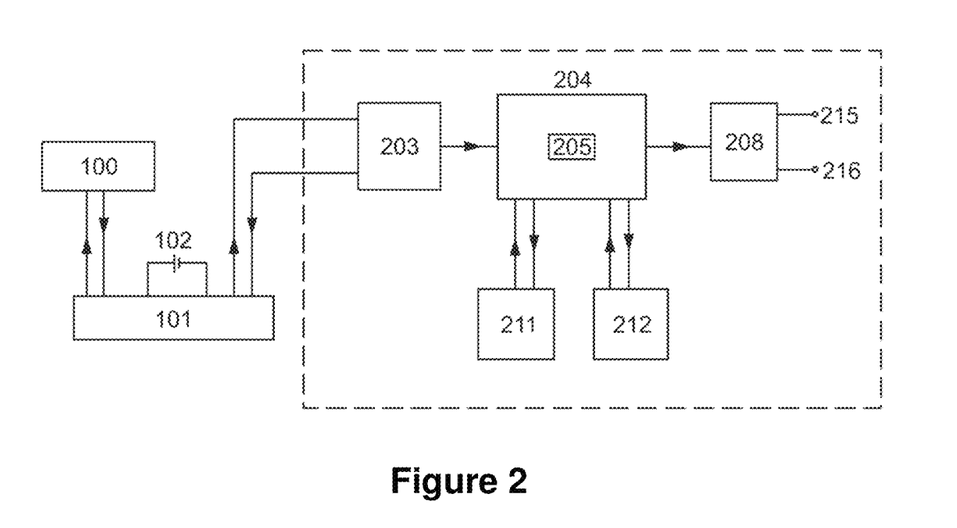
FIG. 2 is a schematic diagram of a high frequency impulse generator for generating fixed frequency of 120 KHz.

The high frequency impulse waves consist of both fixed frequency impulse waves and variable frequency impulse waves which are generated using a system as depicted in FIGS. 1 and 2, respectively. These intersect to create a vector sum of high frequency waves. The first high frequency impulse generator circuit generates variable frequency of 10 to 40 KHz. The second high frequency impulse generator circuit generates fixed frequency of 120 KHz.

Figure 3:
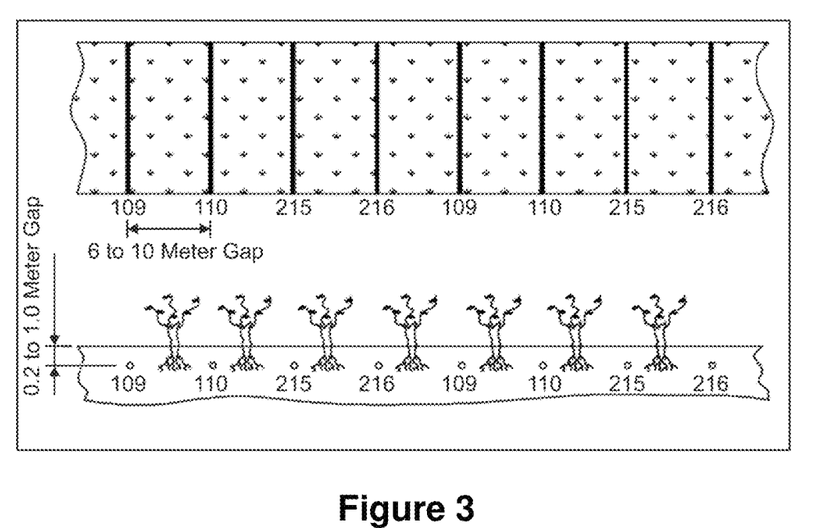
FIG. 3 shows high frequency supply terminals inserted in the soil.

High Frequency Impulse Generator Circuit for Variable Frequency:

Energy may be drawn from solar photovoltaic panels. Excess power is stored in batteries to meet the power requirements during night time or when it is cloudy. According to some embodiments of the present invention, solar power is absorbed from the sun by a solar panel (100) depicted in FIG. 1, and is then passed through a charge controller (101) which charges a 12 VDC battery (102). From the charge controller (101), power is supplied to a power regulator and short circuit protector circuit (103). From the short circuit protector circuit (103), the power flows to a microcontroller circuit (104) which comprises of an oscillator (105) that generates variable frequency impulses, a modulator (106), and a feedback circuit (107). From the feedback circuit (107), the frequency waves pass through a buffer amplifier (108) which stabilizes the voltage and current. In parallel, a reset circuit (111) resets the frequencies intermittently. The microcontroller (104) is connected to the reset circuit (111) and an Internet of things (IOT) module (112). Said oscillator (105) generates a frequency in the range of 10 KHz to 40 KHz. The modulator (106) modulates the oscillator (105) frequency in a sinusoidal pattern. The feedback circuit (107) is used to receive feedback and stabilize the modulation with reference to a frequency which is in the range of 10 KHz to 40 KHz. The buffer amplifier (108) is connected to terminals wherein terminal (109) is the positive terminal and terminal (110) is the negative terminal of the high frequency impulse generator, which are positioned in the soil at a distance of 2 to 15 meters gap, preferably 6 to 10 meters gap between the points of positioning (FIG. 3). The reset circuit (111) facilitates better interference of impulse waves of two different ranges. Said interference results in better nitrogen fixation and SOC of the soil, mobility of nutrients in the soil and plants, and breaks the biofilms in the plant structure.

The 12 VDC Battery (102) is intended to supply power, and ensure that the impulse generator works continuously during day and night to enable mobility of nutrients, ensure proper availability of oxygen to plant roots, and also produce hydrogen molecules for consumption by plant roots throughout the tenure of the crop. The Internet of things (IOT) module (112) can be connected to the farmer's mobile phone to get an intimation about the functioning of the system from time to time. Two different ranges of frequencies are generated to create interference and generate sum of two waves on constructive interference to maximize efficiency with minimum power. A hooter 114 will annunciate the working and sound an alert when the system is not functioning so that a technical problem, if any, is rectified quickly.

High Frequency Impulse Generator Circuit for Fixed Frequency:

Energy may be drawn from solar photovoltaic panels (100) and is then passed through charge controller (101) which charges 12 VDC battery (102). From the charge controller (101), power is supplied to the power regulator and short circuit protector circuit (203). From the power regulator and short circuit protector circuit (203), the power flows to microcontroller circuit (204) which comprises an oscillator (205). The oscillator (205) oscillates and generates desired frequency. The oscillator (205) is connected to a buffer amplifier (208). The buffer amplifier (208) amplifies the voltage and current to desired levels. The oscillator (205) is connected to a reset circuit (211) which resets frequencies intermittently, and the Internet of things (JOT) module (212). The IOT module (112) in FIG. 1 and IOT module (212) in FIG. 2 monitor the device through internet which makes it easy for the farmers to operate and monitor the functioning of the system remotely.

FIG. 3 shows insertion of high frequency supply wires which operate in the voltage range of maximum 12 volts DC, in the soil at a distance of 1 to 15 meters, preferably 6 to 10 meters from each other. Terminals 109, 110 and 215, 216 are connected to the wave generation source points. The constructive interference of high frequency impulse waves occurs within the soil. The inventive method achieves its intended use effectively in different types of soil, at different levels of moisture, and in different types of plants such as tuber crops and cover crops, irrespective of the age of the plants. The wires from said terminals 109, 110, 215, and 216 (FIG. 3) are insulated with powder coating to avoid corrosion of wires due to salinity or moisture in the soil. The wires from said terminals 109, 110, 215, and 216 are inserted permanently in the soil at a depth of 0.2 meter to 1 meter, and at a distance of about 2 meters to 15 meters, preferably 6 meters to 10 meters, from each other. As required power is less than 300 milli amperes per acre (750 milli amperes per hectare), the system has no risk of electrocution to the user. As it operates at a voltage of maximum 15 VAC and power less than 300 milli amperes, it is also safe for microorganisms present in the soil.

Figure 4:
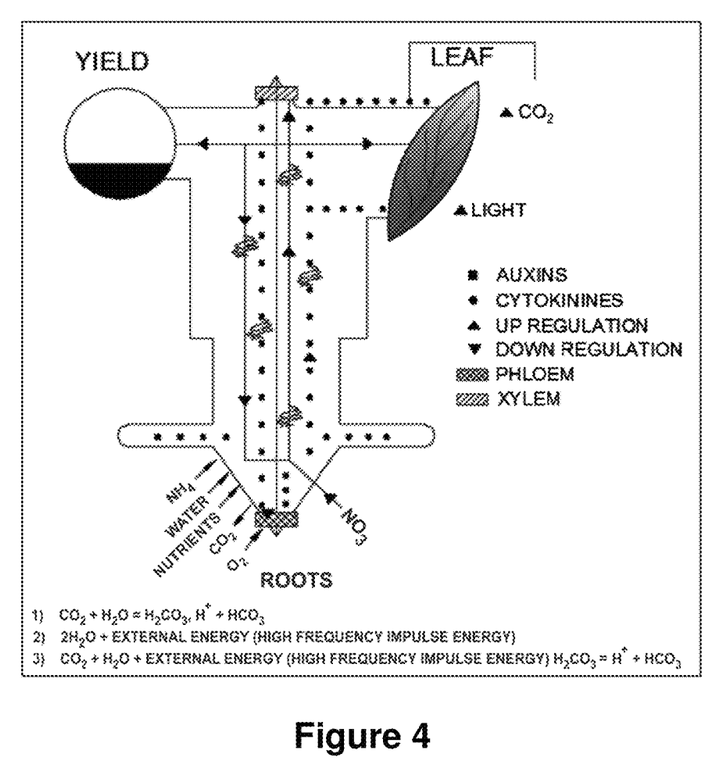
FIG. 4 shows the flow path of high frequency impulse waves inside plant stems and leaves in cover crops.
Figure 5:
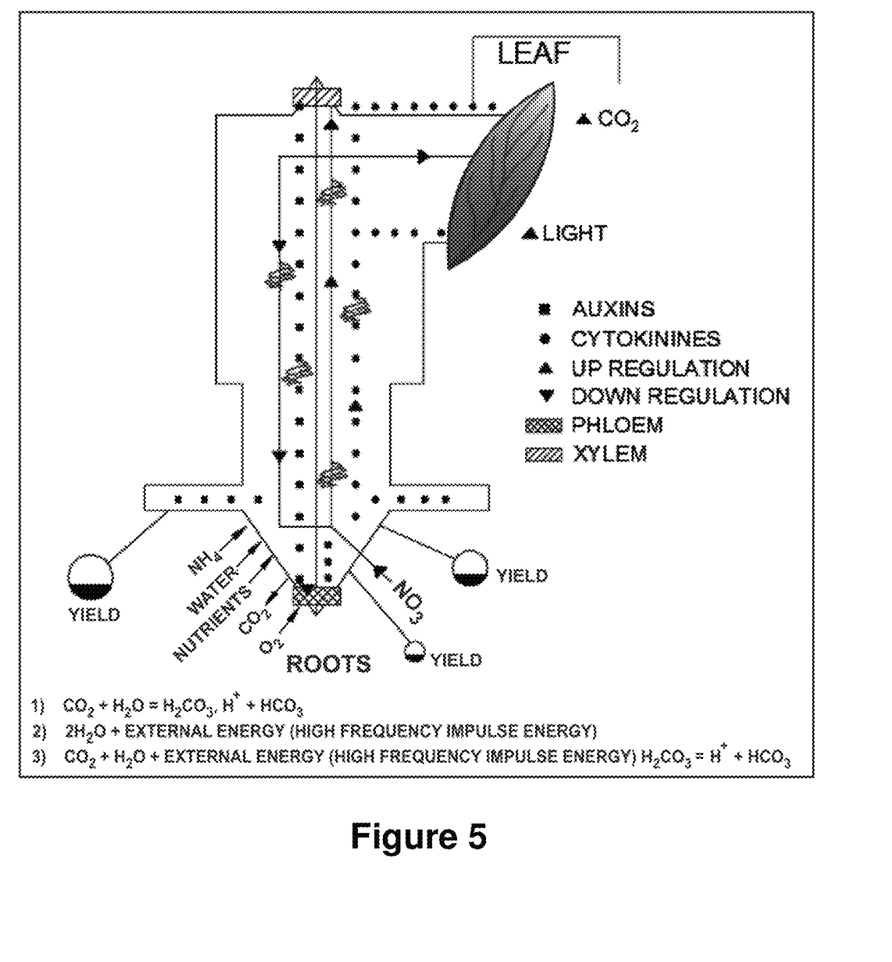
FIG. 5 shows the flow path of high frequency impulse waves inside plant stems and leaves in tuber crops.

FIG. 4 and FIG. 5 show the flow path of high frequency impulse waves inside plant stems and leaves via plant roots, and the mobility of nutrients as well as water inside the plant. FIGS. 4 and 5 also illustrate the mobility of plant nutrients and xylem and phloem in tuber crops and cover crops respectively. The high frequency impulse waves increase the plant's resistance to weeds, pests, and pathogens in tuber crops and cover crops.

The present invention describes a unique non-chemical non-fertilizer method to improve the growth, yield, chlorophyll content, and nutrition value of plants meant for human and animal consumption. It is possible to direct or transport the nutrients in soil towards plant roots for better absorption by plant roots, thereby enhancing the growth of plants and improving the health of the plant without need for any additional treatment.

According to some embodiments of the present invention, solar energy is used to charge the battery thereby storing energy to cater to the power requirement during night times, to ensure uninterrupted power supply. Use of environmentally-friendly solar power, makes the process a sustainable process. In an alternate embodiment, solar energy is sourced directly from the sun without the need of a battery. The stored power is converted into alternate current with high frequency. These high frequency waves are launched into the soil. These high frequency impulse waves play a role in many ways such as, separating the nutrients and soil micelles, converting carbon dioxide ($CO_2$) to carbonic acid, and splitting water molecules into hydrogen and oxygen which are available in close proximity to plant roots. Improved oxygen enrichment of the roots enhances nitrogen fixation. Enhanced amount of chlorophyll in the plant leaves leads to enhanced absorption of light and $CO_2$. $CO_2$ is converted to organic carbon which aids in good plant growth and generation of energy by the plants to absorb nutrients from the soil. Thus absorbed $CO_2$ is converted to organic carbon which reaches the soil. Plant root exudates enhance the number of beneficial microbes present around the roots while inhibiting harmful microbes. These beneficial microbes promote the growth of the plants and store some organic carbon in the soil.

When the high frequency impulse waves travel in the soil at very high velocity in the range of 500-2000 meters per second, nano cracks develop in the soil which enable water penetration into the plant roots and entry of air into the soil. Air contains 21% oxygen gas which is made available to plant roots resulting in better oxygen absorption. The plant roots release carbon dioxide ($CO_2$). When $CO_2$ mixes with water, it gets converted to carbonic acid ($H_2CO_3$). Generally, this conversion of $CO_2$ into carbonic acid ($H_2CO_3$) is around 1% only. However, when high frequency waves propagate, it enhances the reaction rate by more than 80%. When more $H_2CO_3$ is present near the roots, absorption of nutrients is enhanced. These additional nutrients help in better plant growth. The plant growth is enhanced by 30% to 50%. The yield is 25%-50% higher compared to the yield obtained with the use of fertilizers. When sufficient nutrients are absorbed by plant roots, transport by xylem and phloem is enhanced which in turn enhances plant growth and yield. In comparison, when fertilizers are applied to the soil as in the traditional approach, some amount of fertilizers are absorbed by plants and the unabsorbed fertilizers lead to water pollution. Such water pollution can be completely avoided using the novel method of the present invention. Also, many times, pest or weed attack is caused by the excess nitrogen released by the indiscriminate addition of fertilizers to the soil. This is completely eliminated by the novel method of the present invention. When high frequency waves pass through stems and leaves of plants, porosity in membrane cells is enhanced. Due to increased porosity, nutrients and water passing through stems, roots and leaves take a clear and wider path with reduced obstruction. When cells in plant roots become free carriers of nutrients and water, the whole process enhances the performance of xylem and phloem.

Generally, when nutrients and fertilizers are applied to the soil, they are available for adsorption by plant roots for a limited period only, with a possibility of being washed away with water. When high frequency waves are passed, the process of nutrients flowing through xylem/phloem is continuous without interruption throughout 365 days of the year. The roots absorb the nutrients present in the soil as well as the nutrients and fertilizers applied externally. When high frequency impulse waves pass through plants via plant roots, the permeability of plant cell membrane is enhanced which enables more nutrient transportation, translocation or transfusion within the plants uninterruptedly throughout the day and night. The high frequency impulse waves enable the transportation, translocation and transfusion of cytokines and auxins from roots to leaves, and leaves to roots, thus leading to enhanced plant growth and less susceptibility to attack by weeds, pests and pathogens. With reduced susceptibility to attack on plants by weeds, pests, and pathogens, there is a lesser need for pesticides.

The various parameters which affect the mobility of nutrients within the plant include type of soil, moisture content in soil, soil permeability, size and diameter of plant roots, hardness of plant stem and height of plants. While the type of soil, moisture content in soil, soil permeability, and size and diameter of plant roots enhance the mobility of nutrients, hardness of plant stem and height of plants decrease the mobility of nutrients. Mobility of nutrients within the soil and plants requires different ranges of frequencies. In order to enhance the efficiency, multiple frequencies are required. As it is not possible to provide a very wide range of frequencies in any system, intersection of waves within the soil and within the plant is created so as to generate a wide range of frequencies, almost like an avalanche. This phenomenon is explained below.

Interference is a phenomenon in which two waves superimpose each other to form a resultant wave of same, greater, or lower amplitude range. Constructive interference results from the interaction of waves that intersect each other. When the sources of the high-frequency waves are different, and the waves have different range of frequencies, the resultant frequencies can be calculated as mentioned below.

High Frequency Impulse waves with variable Frequency=10-40 KHz

High Frequency Impulse waves with fixed Frequency=120 KHz

The sum of these two waves is 120 KHz+10 KHz=130 KHz; 130 KHz+11 KHz=141 KHz; and 141 KHz+120 KHz=261 KHz, etc.

The wave frequencies multiply as shown above leading to an avalanche effect within the soil.

Of the two types of waves, one has a fixed frequency and the other one has a variable frequency. When superimposed, they generate a frequency which is a sum of the two frequencies. The resulting waves will have a wide range of frequencies like an avalanche effect thereby resulting in faster movement of nutrients in the soil and within the plant. When the high frequency waves intersect, a broad range of frequencies can be generated for nano to microseconds.

| Applied Frequency in KHz | Observed frequency in KHz |
|---|---|
| Variable: 10 to 40 | 3, 11, 44, 66, 139, 392, 689, 798, 980, |
| Fixed: 120 | 1100, 1150, 1392 etc. |
| | (Avalanche-like effect) |

In the present invention, the system is operated at very low energy density which is in the range of 0.1 mA to 0.2 mA per square meter. Low energy density is used so that high power rating does not destroy useful bacteria present in soil and water, and they continue to be available for plant growth.

This varied frequency of waves splits water molecules into hydrogen and oxygen.

$$2H_2O = 2H_2 + O_2$$

Employing the method of the present invention, it has been possible to generate $H_2$ gas molecules in the range of 0.09 ppm to 0.21 ppm from moisture dissolved in the soil. The generated hydrogen ($H_2$) gas was measured using a Trustlex ENH-2000 Molecular Hydrogen Meter. $H_2$ gas molecules improve crop resistance to weeds, pests, and pathogens (Zeng et. al, Medical Gas Research, 2014, 4, 15). When high frequency impulse waves move in the soil at high velocities, the waves generate micro and nano cracks in the soil thus leading to better oxygen dissipation in the soil and improved respiration of the roots. When high frequency impulse waves are passed through plant stems and roots, it breaks the biofilms in plants thereby improving the porosity which enables the adsorption of more nutrients from the soil, which in turn results in better plant growth. When the availability of nutrients is enhanced, for example silicon and calcium in rice, it alleviates attack by weeds, pests, and pathogens thereby reducing the need for pesticides.

Soil permeability and adhesion of nutrients to soil particles depend on multiple factors. If one or two ranges of frequencies are used, it cannot increase the mobility of nutrients in soil and plant. The method of the present invention involves intersection of waves generating wider range of frequencies and intensities to achieve enhanced mobility of nutrients in soil and plants. The mobility of nutrients is enhanced, irrespective of the type of soil or plant. The mobility of nutrients from soil to plant roots increases irrespective of bonding strength, soil permeability, soil compactness, and moisture content in the soil.

Application of high frequency impulse waves to the soil increases water seepage rate by 30%-40%. Water seepage was tested by taking treated and untreated soil compacted to the same height in two 220 litres barrel. In the barrel having untreated soil, the time taken for the seepage of 20 litres of water was observed to be 22.2 hours. In the barrel having treated soil, the time taken for seepage of 20 litres of water was observed to be 16 hours. The faster seepage is due to the micro and nano cracks in the soil. The high frequency waves thus reduce water consumption by 30% to 40%.

The present invention is applicable to tuber crops which produce yield under the soil, and cover crops which produce yield above the soil. Both types of crops need improved xylem and phloem.

The results from trials, in terms of yield, amount of fertilizer and pesticide used, and nutrition value for different plants are presented in Table 1. The comparative table presents results from untreated/control fields (C) and fields which were treated (T) with high frequency impulse waves generated by an intersection of fixed and variable frequency waves inside the soil as explained above.

TABLE 1

Comparative results on yield, nutrition values, and fertilizer and pesticide amounts, from treated (T) and untreated/control (C) fields

| Crop/Plant | Treated field (T) | Untreated/ Control field (C) | % Change |
|---|---|---|---|
| Grains | | | |
| Rice (Kg/Acre) | 2292 | 1672 | +37 |
| Fertilizer quantity (Kg/Acre) | 75 | 115 | −53 |
| No. of pesticide treatment(s) | 1 | 3 | −66 |
| Analysis of Rice grains | | | |
| Iron (mg/Kg) | 298 | 10.8 | +>30 times |
| Silica (mg/Kg) | 900 | 700 | +28 |
| Calcium (mg/Kg) | 13.8 | 10.23 | +35 |
| Tuber crop | | | |
| Onion | 3250 | 2376 | +37 |
| Fruits | | | |
| Banana | | | |
| Fruits per plant | 126 | 78 | +61 |
| Fruit length (cm) | 12.7 | 8.9 | +42 |
| Fruit diameter (cm) | 3.71 | 2.74 | +35 |
| Pomegranate (kg/acre) | 2012 | 1440 | +40 |
| Guava (kg/acre) | 1789 | 1260 | +41 |
| Commercial crop | | | |
| Example: Sugarcane | | | |
| Length (m) | 3.44 | 2.44 | +41 |
| Diameter (cm) | 3.0 | 2.26 | +27 |
| Commercial Plantation Crop | | | |
| Example: Cocoa | | | |
| Yield (Kg/Acre) | 1240 | 820 | +51 |
| Bean count | 113 | 132 | 14% |
| No. of Beans/100 gms | | | |
| Flowering plant | | | |
| Example: Rose | | | |
| No. of branches in plant | 24 | 11 | +118 |
| Yield of flowers during peak season (Kg/Day) | 89 | 55 | +61.8 |

The results indicate a positive trend for different kinds of crops. For Kharif crops, rice was considered as an example. As is evident from Table 1, there is a 37% increase in the yield in paddy crop, when subjected to high frequency impulse waves. Interestingly, there is also a 53% drop in fertilizer quantity added per acre and a 66% drop in pesticide treatment per acre. Moreover, when the rice grains from the treated field were analyzed using Inductively Coupled Plasma (ICP), there was a huge increase (>30 times) in the iron content of rice grains, 28% increase in silica content, and 35% increase in calcium content.

Among tuber crops, onion was considered as an example. Onion plants were subjected to treatment by high frequency impulse waves generated by the intersection of fixed and variable frequency waves inside the soil. The increase in yield was found to be 37%.

Among fruits, banana, guava and pomegranate were selected for the study. On subjecting these plants to high frequency impulse waves generated by the inventive method of the present invention, the fruit yield per plant increased by 61%. The bananas were longer and thicker. An increase of 42% was found in the fruit length and 35% increase in the fruit diameter. Similarly, pomegranate showed an increase of 40% in its yield, and guava showed an increase of 41%.

Sugarcane, a commercial crop, showed an increase in length of 41% and a diameter of 27%. Cocoa, another commercial plantation crop, demonstrated an increase of yield by 51%. The number of beans weighing 100 grams decreased, indicating an increase in bean weight thereby resulting in the reduction in number of cocoa beans.

In the case of flowering plants (example: rose), the number of branches in the plant increased by 118%, and in peak season, the daily average yield of rose flowers increased by 62%.

Studies were conducted considering plants such as banana, palm, cocoa, lemon and coconut as samples. Studies were conducted to assess the impact of the present invention on other parameters such as root mass, chlorophyll content, extent of photosynthesis in plants, nitrogen fixation ability, SOC, and carbon sequestration in soil. Photosynthesis depends on the chlorophyll present in the leaves, size of leaves and quantity of leaves of a plant. The chlorophyll content in different plants, viz., banana, palm, cocoa, lemon and coconut, across different farms was measured using a Chlorophyll Meter TYS-B from TOP Cloud-Agri Technology. The chlorophyll content in untreated plants (C) and plants treated (T) with high-frequency waves is shown in Table 2.

TABLE 2

Chlorophyll content in plants before and after application of high-frequency waves

| | BANANA | | PALM | | COCOA | | LEMON | | COCONUT | |
|---|---|---|---|---|---|---|---|---|---|---|
| | C FIELD | T FIELD | C FIELD | T FIELD | C FIELD | T FIELD | C FIELD | T FIELD | C FIELD | T FIELD |
| FARM 1 | | | | | | | | | | |
| Average value % increase in chlorophyll | 72 | 84 16 | NA | NA | NA | NA | NA | NA | NA | NA |
| FARM 2 | | | | | | | | | | |
| Average value % increase in chlorophyll | NA | NA | NA | NA | 49.2 | 56.6 15 | NA | NA | 63.1 | 73.5 16.5 |
| FARM 3 | | | | | | | | | | |
| Average value % increase in chlorophyll | NA | NA | NA | NA | 50.0 | 63.2 26.5 | 52.4 | 58.4 11.4 | NA | NA |

TABLE 2-continued

Chlorophyll content in plants before and after application of high-frequency waves

| | BANANA | | PALM | | COCOA | | LEMON | | COCONUT | |
|---|---|---|---|---|---|---|---|---|---|---|
| | C FIELD | T FIELD | C FIELD | T FIELD | C FIELD | T FIELD | C FIELD | T FIELD | C FIELD | T FIELD |
| FARM 4 | | | | | | | | | | |
| Average value % increase in chlorophyll | NA | NA | 76.8 | 82.9 7.9 | NA | NA | NA | NA | NA | NA |
| FARM 5 | | | | | | | | | | |
| Average value % increase in chlorophyll | NA | NA | 72.3 | 76.7 6.1 | NA | NA | NA | NA | NA | NA |

C FIELD—Control/Untreated field;
T FIELD—Treated field

Figure 6:
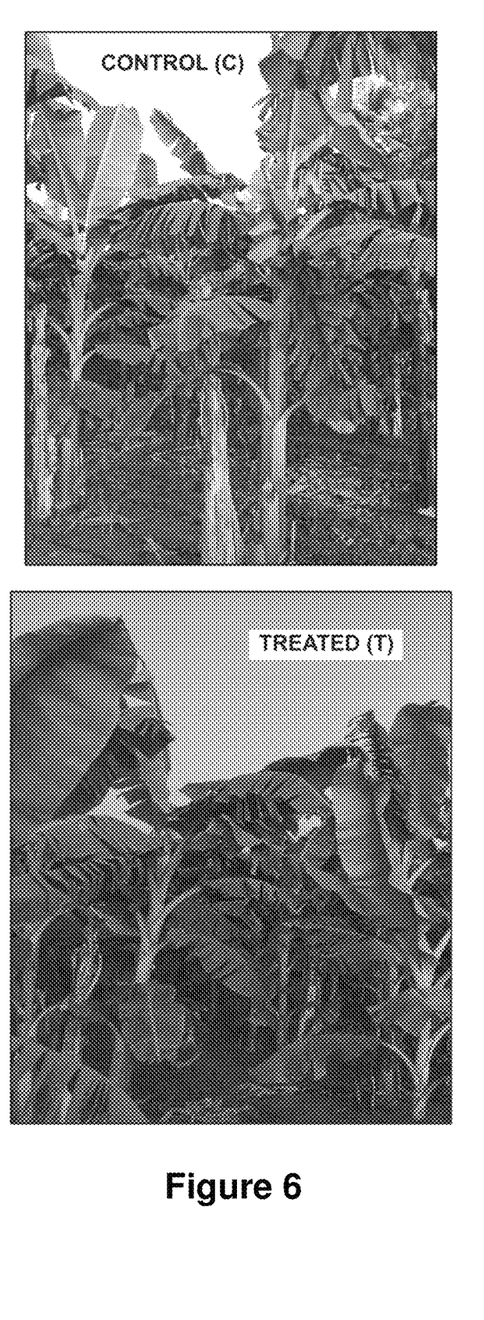
FIG. 6 shows the leaves and plant growth in Control (C) and Treated (T) banana plants.

From field studies, it is observed that the increase in chlorophyll content is between about 5% to about 40% Enhanced chlorophyll content is also indicative of more effective photosynthesis. It was observed that the root mass in terms of length, count and diameter is more in treated (T) fields (300-400%) due to more photosynthesis sand ample oxygen supply to plant roots. In T fields, more chlorophyll was observed due to a greater number of leaves, and leads to increased absorption of carbon dioxide and sunlight. This further enhances production of the required glucose and carbohydrates. Some of this generates energy for the absorption of nutrients from soil and plant growth while some will be converted as Soil Organic Carbon (SOC) in the soil. More root mass leads to more nutrient absorption and generation of more healthy plants and better yield. In said intercrop T plants, an enhancement of yield by 70% was observed. Enhanced photosynthesis for a given plant leads to more $CO_2$ intake and more conversion of SOC, and carbohydrates and glucose. This is evident from the increased root mass, bigger and lush green leaves (FIG. 6) apart from the soil tests conducted after a gap of 10 months on several field samples. Plants with wider leaves comprise more chlorophyll thus enabling enhanced absorption of $CO_2$ from air and conversion of $CO_2$ into hydrocarbonate. Carbonates and glucose are transported towards the plant roots. Thus absorbed $CO_2$ will be used for plant sustenance, growth and health while some of it converts to organic carbon, also known as Soil Organic Carbon (SOC). SOC was assessed both before and after application of the present invention, and it was observed to have been enhanced by 116% (Table 2). When air ($N_2$ and $O_2$) is pumped to the plant roots through the nano or micro cracks generated in the soil due to the application of the method and system of the present invention, the supply of oxygen to the bacteria present in the soil is good and aids in their survival and growth. When grown bacteria are fermented several times, these bacteria fix nitrogen in the form of ammonia which is highly essential for the sustainability, growth and health of the plant. It was observed that the amount of nitrogen was enhanced by 112% in soils (Table 3).

TABLE 3

Soil studies before and after application of high-frequency waves

| Parameter | Untreated field (C) | Treated field (T) (After 10 months of treatment) |
|---|---|---|
| pH | 7.7 | 8.21 |
| EC (mS/cm) | 0.4 | 0.12 |
| Organic Carbon (%) | 0.3 | 0.65 |
| Available Nitrogen (Kg/ha) | 211 | 447 |
| Phosphorus (Kg/ha) | 65 | 422.3 |
| Zinc (mg/Kg) | 0.7 | 1.5 |
| Iron (mg/Kg) | 0.1 | 5.1 |

It was observed that the growth of roots was enhanced by 250% in T fields compared to C fields.

Globally, methane generation in rice cultivation alone is estimated to be 60 million tons. A major source of methane generation is water flooded paddy cultivation. When fields are flooded with water, microbes present in the soil starve for oxygen for survival and multiplication. This problem can be addressed through proper oxygen supply to plant roots. If oxygen supply is good and the soil is porous, root mass and growth will be good.

Figure 7:
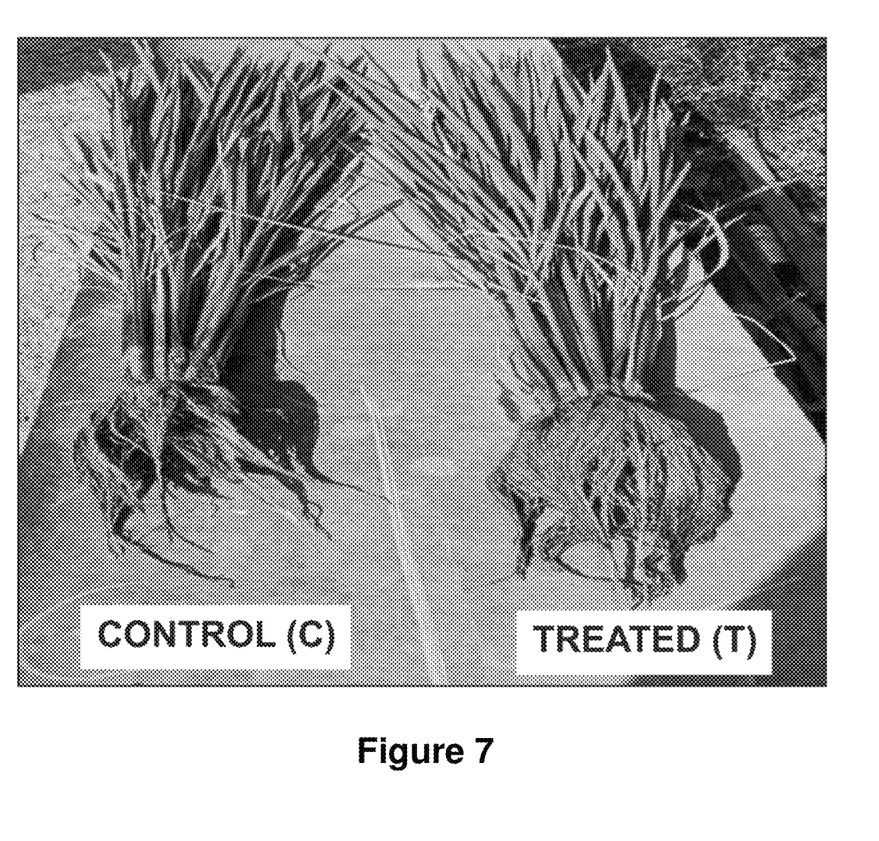
FIG. 7 shows the root mass in Control (C) and Treated (T) plants.

Also, survival of the microbes present in the soil is at stake when there is excessive use of chemical fertilizers and pesticides. Root growth depends on soil porosity and intake of nutrients and microbes within soil. As can be seen in FIG. 7, the root mass is high in the case of treated (T) fields compared to Untreated/Control (C) fields where use of fertilizers and pesticides was high. Increase in the root mass leads to efficient and effective absorption of nutrients and also releases more root exudates into the soil. The exudates which are a combination of amino acids, organic acids, sugars and vitamins help communication between the soil and plant, and also aid in the increase of soil organic carbon.

Treatment of soil by the method and system of the present invention, is an approach that counters the aforementioned issues. Said approach creates nano cracks in the soil, provides the roots with ample supply of air/$O_2$, and enables aerobic respiration instead of anaerobic respiration thereby reducing methane generation significantly.

The present invention provides a method for increasing the growth, yield and nutrition value of plants, comprising delivery of fixed and variable high frequency waves through a system, and directing said high frequency waves into the soil and creating an avalanche within the soil, thereby enhancing the mobility of nutrients in the soil and within the plant; wherein the system comprises of a microcontroller (104) comprising a module comprising an oscillator (105) for generating variable frequency impulses, a modulator (106), and a feedback circuit (107), a buffer amplifier (108), a reset circuit (111) to reset the frequencies intermittently, two or more terminals (109, 110) wherefrom electrode wires emerge for insertion into the soil, and an IOT module (112); and the system further comprises a microcontroller (204) module comprising an oscillator (205) for generating fixed frequency impulses, a reset circuit (211) to reset the frequencies intermittently, and two or more terminals (215, 216) wherefrom electrode wires emerge for insertion into the soil, and an IOT module (212); and a common energy source (100) for power supply.

The variable frequency is between 10 KHz and 40 KHz, and the fixed frequency is 120 KHz. The variable frequency electrodes wires alternate with fixed frequency electrode wires. The electrode wires are made of conductive steel alloy or stainless steel, and are placed at a depth of 0.2 to 1.0 meter at a distance of 2 to 15 meters from each other within the soil.

The present invention provides a novel method for enhancing plant growth, yield, chlorophyll content, and nutrition value while rendering several other benefits. The method of the present invention enables carbonic acid generation at the roots to facilitate better exchange of nutrient ions in the soil, enhancing nutrient movement in plant membranes, improving oxygen permeability in roots by creating nano cracks in the soil, increasing soil permeability, enabling generation of hydrogen by splitting the water molecules, breaking biofilms in all types of plants to enhance the functioning of xylem and phloem and improving the transportation of nutrients within plants, increasing the strength of micro structure of plant stems, improving the transportation of carbohydrates and glucose from plant leaves to roots, reducing fertilizer use for crop cultivation and protecting soil acidification, and reducing greenhouse gas emissions resulting from the manufacture, transportation and application of fertilizers and pesticides and cultivation of crops with reduced water usage.

It is to be understood, however, that the present invention would not be limited by any means to the components, arrangements and materials that are not specifically described, and any change to the materials, variations, and modifications can be made without departing from the spirit and scope described in the present invention.

We claim:

1. A method for increasing the growth, yield, nutrition value and chlorophyll content, and for reducing water consumption in plants, comprising: delivering a vector sum of high frequency impulse waves resulting from an intersection of fixed frequency waves of 120 KHz and variable frequency waves in the range of 10 KHz to 40 KHz through a system to create an avalanche of a broad range of high frequency waves in the soil,
    wherein the system comprises of:
        a first microcontroller (104) comprising of:
            a module consisting of an oscillator (105) for generating said variable frequency impulses, a modulator (106), and a feedback circuit (107);
            a buffer amplifier (108);
            a reset circuit (111) for resetting frequencies intermittently;
            two or more terminals (109,110) wherefrom electrode wires emerge for insertion into the soil; and
            an Internet of things (IOT) module (112);
        a second microcontroller (204) comprising of:
            a module consisting of an oscillator (205) for generating said fixed frequency impulses;
            a buffer amplifier (208);
            a reset circuit (211) for resetting frequencies intermittently;
            two or more terminals (215, 216) wherefrom electrode wires emerge for insertion into the soil; and
            an Internet of things (IOT) module (212); and
        an energy source (100).

2. The method as claimed in claim 1, wherein said variable frequency electrodes wires alternate with fixed frequency electrode wires.

3. The method as claimed in claim 1, wherein said electrode wires are made of conductive steel alloy or stainless steel.

4. The method as claimed in claim 1, wherein said electrode wires are placed at a depth of 0.2 to 1.0 meter within said soil.

5. The method as claimed in claim 1, wherein said electrode wires are placed at a distance of 2 to 15 meters within said soil.

6. The method as claimed in claim 1, wherein said energy source is solar energy.

7. The method as claimed in claim 1, wherein said high frequency waves enhance plant growth by 30% to 50%.

8. The method as claimed in claim 1, wherein said high frequency waves enhance plant yield by 25% to 50%.

9. The method as claimed in claim 1, wherein said high frequency waves reduce water consumption by 30% to 40%.

10. The method as claimed in claim 1, wherein said plants are cover crops or tuber crops.

11. The method as claimed in claim 1, wherein the usage of fertilizers is reduced by 30% to 60%.

12. The method as claimed in claim 1, wherein the usage of pesticides is reduced by 40% to 60%.

13. The method as claimed in claim 1, wherein the nutrition value of said plants is enhanced by a factor of 2 to 3.

14. The method as claimed in claim 1, wherein said high frequency waves enhance breaking of biofilms in said plants.

15. The method as claimed in claim 1, wherein said high frequency waves enhance mobility and efficiency of xylem and phloem within said plants.

16. The method as claimed in claim 1, wherein said high frequency waves enhance mobility of nutrients in said soil.

17. The method as claimed in claim 1, wherein said high frequency waves enhance generation of hydrogen in said soil.

18. The method as claimed in claim 1, wherein said high frequency waves convert carbon dioxide into carbonic acid.

19. The method as claimed in claim 1, wherein said high frequency waves create micro cracks and nano cracks in said soil.

20. The method as claimed in claim 1, wherein said high frequency waves enhance permeability of said soil.

21. The method as claimed in claim 1, wherein said high frequency waves enhance nitrogen fixation.

22. The method as claimed in claim 1, wherein said high frequency waves enhance carbon sequestration.

23. The method as claimed in claim 1, wherein said high frequency waves enhance the chlorophyll content of said plants by 5% to 40%.

* * * * *